(12) United States Patent
Jung et al.

(10) Patent No.: US 8,842,464 B2
(45) Date of Patent: Sep. 23, 2014

(54) STATIC RANDOM ACCESS MEMORY DEVICE INCLUDING NEGATIVE VOLTAGE LEVEL SHIFTER

(75) Inventors: Jonghoon Jung, Hwaseong-si (KR); Sounghoon Sim, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 344 days.

(21) Appl. No.: 13/186,245

(22) Filed: Jul. 19, 2011

(65) Prior Publication Data
US 2012/0020146 A1    Jan. 26, 2012

(30) Foreign Application Priority Data
Jul. 23, 2010 (KR) ............... 10-2010-0071591

(51) Int. Cl.
*G11C 11/00* (2006.01)
*G11C 11/413* (2006.01)

(52) U.S. Cl.
CPC .................. *G11C 11/413* (2013.01)
USPC .............. 365/154; 365/129; 365/230.05

(58) Field of Classification Search
USPC ................... 365/154, 156, 230.06
See application file for complete search history.

(56) References Cited

U.S. PATENT DOCUMENTS 5,287,310 A * 2/1994 Schreck et al. .......... 365/189.05
5,708,599 A * 1/1998 Sato et al. ................. 365/154
6,310,795 B1 * 10/2001 Morishima ................ 365/63
6,671,201 B2 * 12/2003 Masuda ..................... 365/154
7,379,354 B2   5/2008 Heinrich-Barna et al.
(Continued)

FOREIGN PATENT DOCUMENTS

JP    2002-298586    10/2002

OTHER PUBLICATIONS

Yamaoka et al. "Low Power SRAM Menu for SOC Application Using Yin-Yang-Feedback Memory Cell Technology" 2004 Symposium on VLSI Circuits Digest of Technical Papers, pp. 288-291.

*Primary Examiner* — Son Dinh
*Assistant Examiner* — Uyen B Tran
(74) *Attorney, Agent, or Firm* — Myers Bigel Sibley & Sajovec, PA

(57) ABSTRACT

Integrated circuit memory devices include an array of static random access memory (SRAM) cells arranged as a plurality of columns of SRAM cells electrically coupled to corresponding plurality of pairs of bit lines and a plurality of rows of SRAM cells electrically coupled to a corresponding plurality of word lines. A word line driver and a column decoder are provided. The word line driver, which is electrically coupled to the plurality of word lines, is configured to drive a selected word line with a positive voltage and a plurality of unselected word lines with a negative voltage during an operation to write data into a selected one of the SRAM cells. The column decoder includes a plurality of pairs of selection switches therein, which are electrically coupled to corresponding ones of the plurality of pairs of bit lines. The column decoder is configured to drive control terminals of a first of the plurality of pairs of selection switches coupled to the selected one of the SRAM cells with positive voltages concurrently with driving control terminals of a second of the plurality of pairs of selection switches coupled to an unselected one of the SRAM cells with negative voltages during the operation to write data.

13 Claims, 12 Drawing Sheets

(56) References Cited

U.S. PATENT DOCUMENTS

| | | | |
|---|---|---|---|
| 7,751,229 B2* | 7/2010 | Dray et al. | 365/154 |
| 2007/0081379 A1 | 4/2007 | Clinton et al. | |
| 2007/0104002 A1* | 5/2007 | Edahiro | 365/203 |
| 2008/0112212 A1* | 5/2008 | Wang et al. | 365/154 |
| 2008/0130380 A1* | 6/2008 | Wang et al. | 365/189.16 |
| 2009/0235171 A1 | 9/2009 | Adams et al. | |
| 2010/0188909 A1* | 7/2010 | Kenkare et al. | 365/189.16 |
| 2012/0140551 A1* | 6/2012 | Arsovski et al. | 365/154 |

\* cited by examiner

STATIC RANDOM ACCESS MEMORY DEVICE INCLUDING NEGATIVE VOLTAGE LEVEL SHIFTER

REFERENCE TO PRIORITY APPLICATION

This application claims the benefits, under 35 U.S.C. §119, of Korean Patent Application No. 10-2010-0071591 filed Jul. 23, 2010, the entirety of which is hereby incorporated by reference herein.

FIELD OF THE INVENTION

Exemplary embodiments relate to semiconductor memory devices and, more particularly, to static random access memory devices and methods of operating same.

BACKGROUND

Semiconductor memory devices are classified into volatile memory devices, which lose stored data at power-off, and non-volatile memory devices, which retain stored data even at power-off.

Volatile memory devices may include a Static Random Access Memory (SRAM), which stores data using latches, and a Dynamic Random Access Memory (DRAM), which stores data using capacitors, according to a data storing manner. SRAM has low integrity and capacity compared to DRAM. But, SRAM is mainly used as cache memory of memory controller because its peripheral circuits are simple in configuration and it operates in high speed.

Semiconductor elements become fine according to advance in semiconductor fabrication technologies. This causes increase in distributions of basic process characteristics of semiconductor elements. For example, in case of SRAM, there are increased distributions of characteristics necessary for designing such as Static Noise Margin (SNM), write margin, sense margin, and the like. Increase in distributions causes difficulty in developing SRAM and decreases stability of memory cells. As a result, the yield may decrease.

Approaches of solving the above-described problems may include a method of improving process distributions. But, it is limited to increase the stability of memory cells and the yield through the method of improving process distributions.

SUMMARY OF THE INVENTION

Integrated circuit memory devices according to embodiments of the invention include an array of static random access memory (SRAM) cells arranged as a plurality of columns of SRAM cells electrically coupled to corresponding plurality of pairs of bit lines and a plurality of rows of SRAM cells electrically coupled to a corresponding plurality of word lines. A word line driver and a column decoder are also provided. The word line driver, which is electrically coupled to the plurality of word lines, is configured to drive a selected word line with a positive voltage and a plurality of unselected word lines with a negative voltage during an operation to write data into a selected one of the SRAM cells. The column decoder includes a plurality of pairs of selection switches therein, which are electrically coupled to corresponding ones of the plurality of pairs of bit lines. The column decoder is configured to drive control terminals of a first of the plurality of pairs of selection switches coupled to the selected one of the SRAM cells with positive voltages concurrently with driving control terminals of a second of the plurality of pairs of selection switches coupled to an unselected one of the SRAM cells with negative voltages during the operation to write data.

According to additional embodiments of the invention, the selection switches are pass gate transistors and the control terminals of the selection switches are gate electrodes of respective pass gate transistors. The word line driver may also include a row decoder therein, which is electrically coupled to the plurality of word lines. According to still further embodiments of the invention, a write/data driver is provided. This write driver is electrically coupled to the column decoder. The write driver is configured to drive a first of a pair of bit lines electrically coupled to the selected one of the SRAM cells with a negative voltage during the operation to write data. This write driver performs the driving function by passing complementary/differential data to a pair of selected bit lines via the column decoder. According to still further embodiments of the invention, the write driver and the row decoder comprise respective negative voltage level shifters therein.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
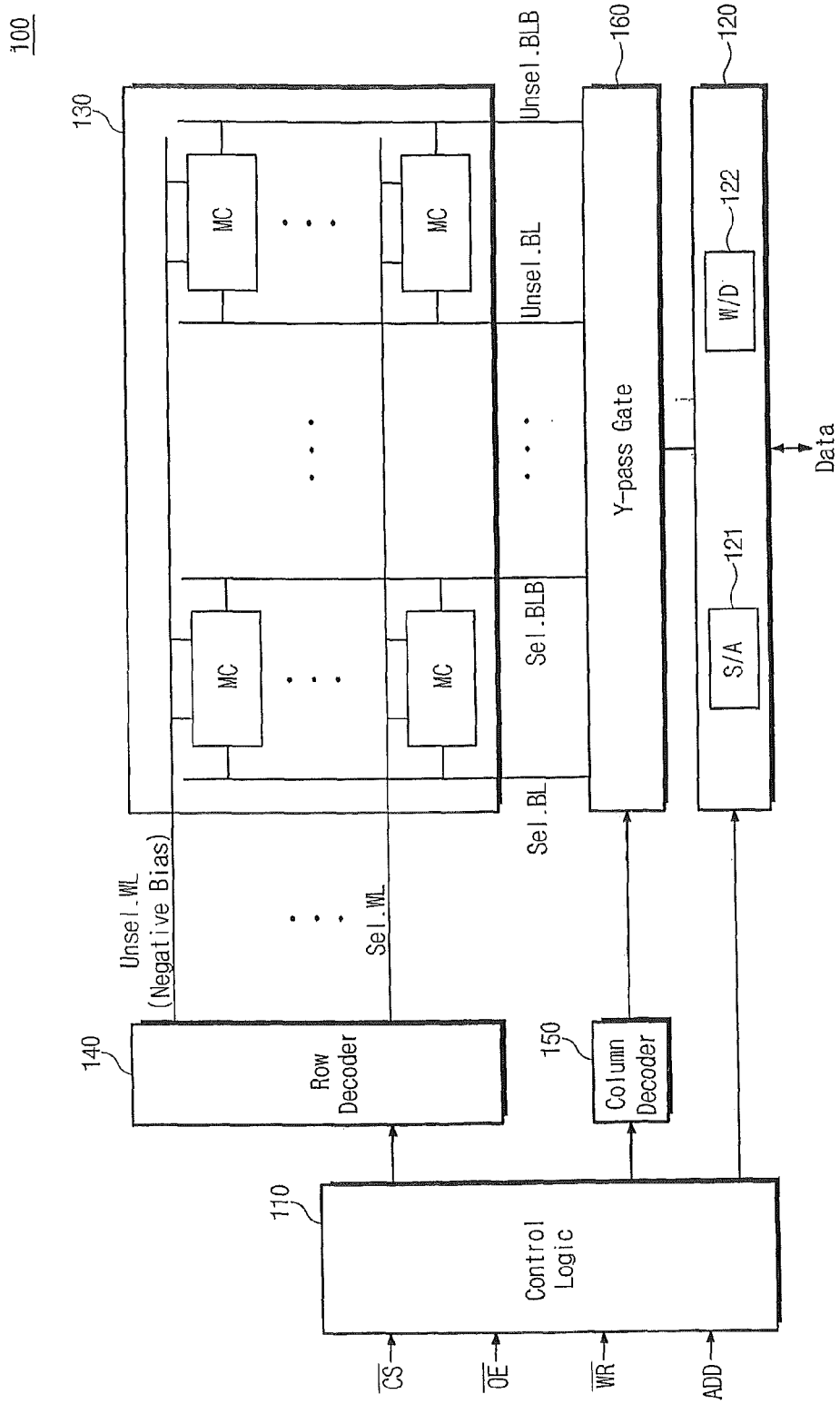
FIG. 1 is a block diagram showing a static random access memory device according to an exemplary embodiment of the inventive concept.

The inventive concept is described more fully hereinafter with reference to the accompanying drawings, in which embodiments of the inventive concept are shown. This inventive concept may, however, be embodied in many different forms and should not be construed as limited to the embodiments set forth herein. Rather, these embodiments are provided so that this disclosure will be thorough and complete, and will fully convey the scope of the inventive concept to those skilled in the art. In the drawings, the size and relative sizes of layers and regions may be exaggerated for clarity. Like numbers refer to like elements throughout.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

FIG. 1 is a block diagram showing a static random access memory device according to an exemplary embodiment of the inventive concept. Referring to FIG. 1, a static random access memory device 100 includes control logic 110, a sense amplifier and write driver block 120, a memory cell array 130, a row decoder 140, a column decoder 150, and a Y-pass gate 160. The control logic 110 controls an overall operation (for example, write and read operations) of the static random access memory device 100 in response to control signals (for example, /CS, /OE, /WE) and an address ADD from an external source (for example, a host, a memory controller, or a memory interface). With an exemplary embodiment of the inventive concept, the control logic 110 controls such that a negative voltage is applied to a selected bit line, unselected word lines, and pass gates of unselected bit lines at a write operation. Further, the control logic 110 controls such that a negative voltage is applied to a pass gate of a selected bit line and a ground node of a sense amplifier at a read operation.

The sense amplifier and write driver block 120 interfaces data via a data input/output buffer (not shown), and includes a sense amplifier 121 and a write driver 122. The sense amplifier 121 reads data stored in a selected memory cell of a plurality of memory cells by amplifying a voltage difference between a bit line and an inverted bit line (being referred to as a bit bar line) connected with the selected memory cell. Read data may be provided to an external source of the static random access memory device 100 via the data input/output buffer. The write driver 122 writes data received via the data input/output buffer in a selected memory cell of a plurality of memory cells. The sense amplifier and write driver block 120 may operate responsive to the control of the control logic 110.

The memory cell array 130 includes a plurality of memory cells each storing data. Each of the memory cells may be formed of a type of latch composed of six transistors. For example, each memory cell may be formed of a full-CMOS SRAM cell which has six CMOS transistors, But, it is well understood that each memory cell is not limited to the full-CMOS SRAM cell, For example, each memory cell may be formed of a High Load Resistor (LHR) type or Thin Film Transistor (TFT) type SRAM cell according to elements constituting pull-up transistors.

The memory cells of the memory cell array 130 are connected with a plurality of word lines and a plurality of bit line pairs, respectively. The row decoder 140 selects one of the plurality of word lines in response to a row address in order to select one of the plurality of memory cells. The column decoder 150 selects one of the plurality of bit line pairs in response to a column address in order to select one of the plurality of memory cells. The Y-pass gate 160 is selected according to a control signal of the column decoder 150 and connects any one of the plurality of bit line pairs with a data line pair or the sense amplifier 121. That is, the Y-pass gate 160 may be formed of selection transistors for selecting any one of the plurality of bit line pairs.

A memory cell connected with the word line selected by the row decoder 140 and a bit line pair selected by the Y-pass gate 160 is called a selected memory cell. Memory cells connected with the word line selected by the row decoder 140 and unselected bit line pairs are called half-selected memory cells. Memory cell connected with unselected word lines and unselected bit line pairs are called unselected memory cells.

In accordance with an exemplary embodiment of the inventive concept, a negative voltage is applied to a selected bit line pair, unselected word lines, and Y-pass gates of unselected bit line pairs in order to improve the write margin. That is, at a write operation, a negative voltage is applied to any one bit line of the selected bit line pair according to data being written to a selected memory cell. Further, at the write operation, a negative voltage is applied to unselected word lines in order to prevent the retention characteristics of unselected memory cells from being lowered due to a negative voltage applied to a selected bit line pair (that is, any one bit line of the selected bit line pair). Further, a negative gate is applied to Y-pass gates of unselected bit line pairs in order to prevent the retention characteristics of half-selected memory cells from being lowered due to a negative voltage applied to a selected bit line pair (that is, any one bit line of the selected bit line pair).

On the other hand, at a read operation, a negative voltage is applied to a Y-pass gate of a selected bit line pair and a ground node of the sense amplifier 120 in order to improve the sensing characteristics (for example, to improve the sensing margin or to reduce a sensing time). A negative voltage used at a read or write operation may be provided from an external source of the static random access memory device 100 or generated from an internal voltage generator (not shown) thereof. A negative voltage level shifter may be used to transfer the negative voltage from the external source or the voltage generator.

Figure 2:
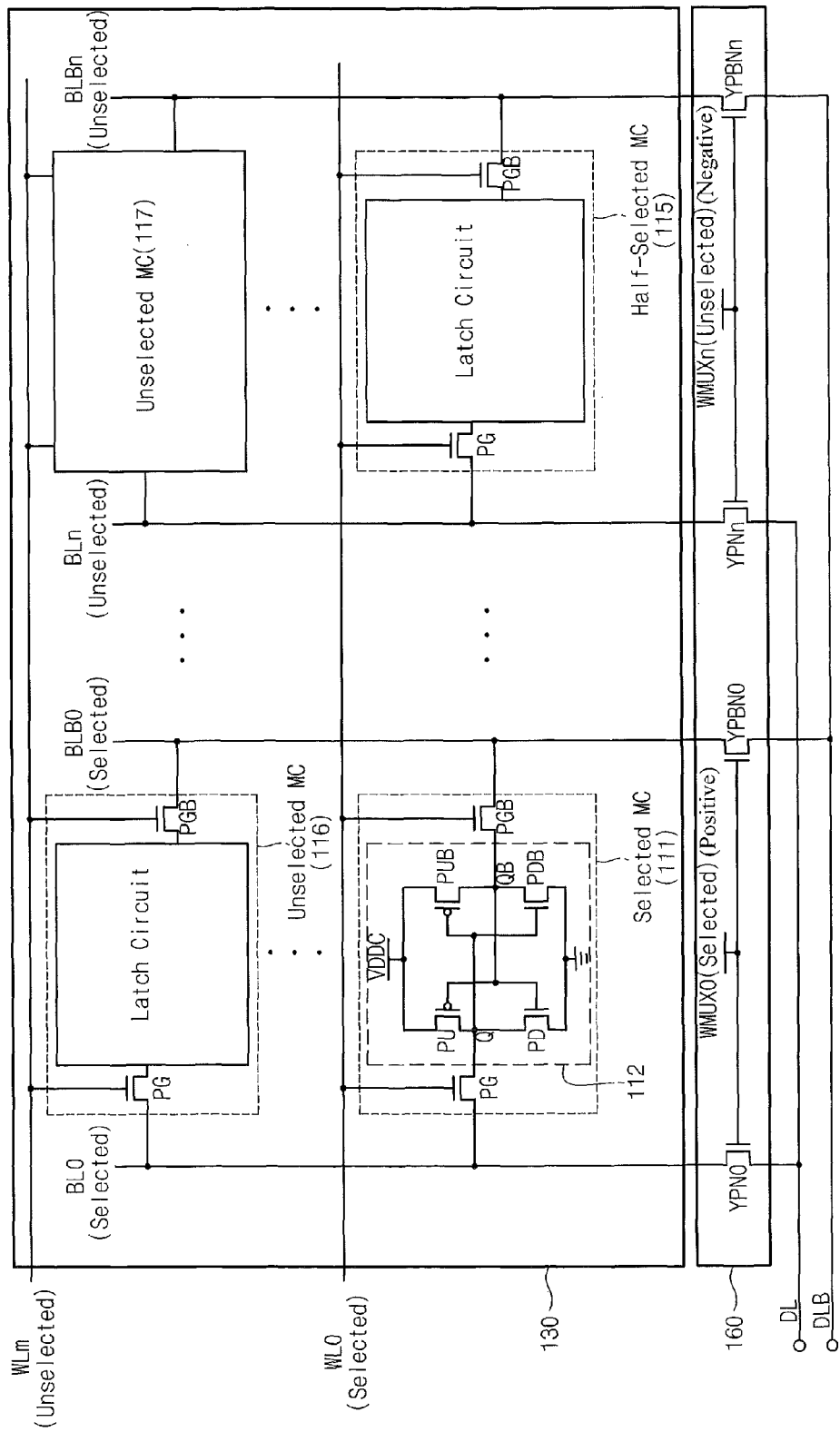
FIG. 2 is a circuit diagram showing a memory cell array and a Y-pass gate illustrated in FIG. 1.

FIG. 2 is a circuit diagram showing a memory cell array and a Y-pass gate illustrated in FIG. 1. A plurality of memory cells in a memory cell array 130, are connected with a plurality of word lines and a plurality of bit line pairs, respectively. Referring to FIG. 2, the memory cell array 130 includes a selected memory cell 111 connected with a selected bit line pair BL0 and BLB0 and a selected word line WL0, a half-selected memory cell 115 connected with an unselected bit line pair BLn and BLBn and the selected word line WL0, and unselected memory cells 116 and 117 connected with an unselected word line WLm. The selected memory cell 111 is connected with the selected word line WL0 and the selected bit line pair BL0 and BLB0 being a data input/output path. The selected memory cell 111 includes the first pass transistor PG, the second pass transistor PGB, and a latch circuit 112. A gate of the first pass transistor PG is connected with the selected word line WL0 and its one end is connected with the selected bit line BL0. When the selected word line WL0 is activated logically 'High', the first pass transistor PG connects the selected bit line BL0 and the first data storage node Q. A gate of the second pass transistor PGB is connected with the selected word line WL0 and its one end is connected with the selected bit bar line BLB0. When the selected word line WL0 is activated logically 'High', the second pass transistor PGB connects the selected bit bar line BLB0 and the second data storage node QB. The latch circuit 112 is connected between the first pass transistor PG and the second pass transistor PGB and stores data.

The latch circuit 112 includes the first pull-up transistor PU, the second pull-up transistor PUB, the first pull-down transistor PD, and the second pull-down transistor PDB. One end of the first pull-up transistor PU is connected with a power supply voltage VDDC, and its other end is connected with the other end of the first pass transistor PG. One end of the first pull-down transistor PD is connected with the other end of the first pass transistor PG. The other end of the first pull-down transistor PD is grounded. The first pull-up transistor PU and the first pull-down transistor PD supply a power supply voltage VDDC or a ground voltage to the first data storage node Q in response to a signal of the second data storage node QB.

One end of the second pull-up transistor PUB is connected with a power supply voltage VDDC for a memory cell, and its other end is connected with the other end of the second pass transistor PGB. One end of the second pull-down transistor PDB is connected with the other end of the second pass transistor PGB. The other end of the second pull-down transistor PDB is grounded. The second pull-up transistor PUB and the second pull-down transistor PDB supply a power supply voltage VDDC or a ground voltage to the second data storage node QB in response to a signal of the first data storage node Q.

In order to improve the write margin when data is written in the selected memory cell 111, it is necessary to reduce the amount of a current flowing through the first pull-up transistor PU and the second pull-up transistor PUB. Alternatively, it is necessary to increase the amount of a current flowing through the first or second pass transistor PG or PGB in order to improve the write margin. It is possible to control the amount of a current flowing via the first or second pass transistor PG or PGB using a bit line voltage. That is, the amount of a current flowing via the first or second pass transistor PG or PGB may increase by lowering a voltage of a selected bit line pair below a ground voltage. This will be more fully described with reference to FIG. 3.

Figure 3:
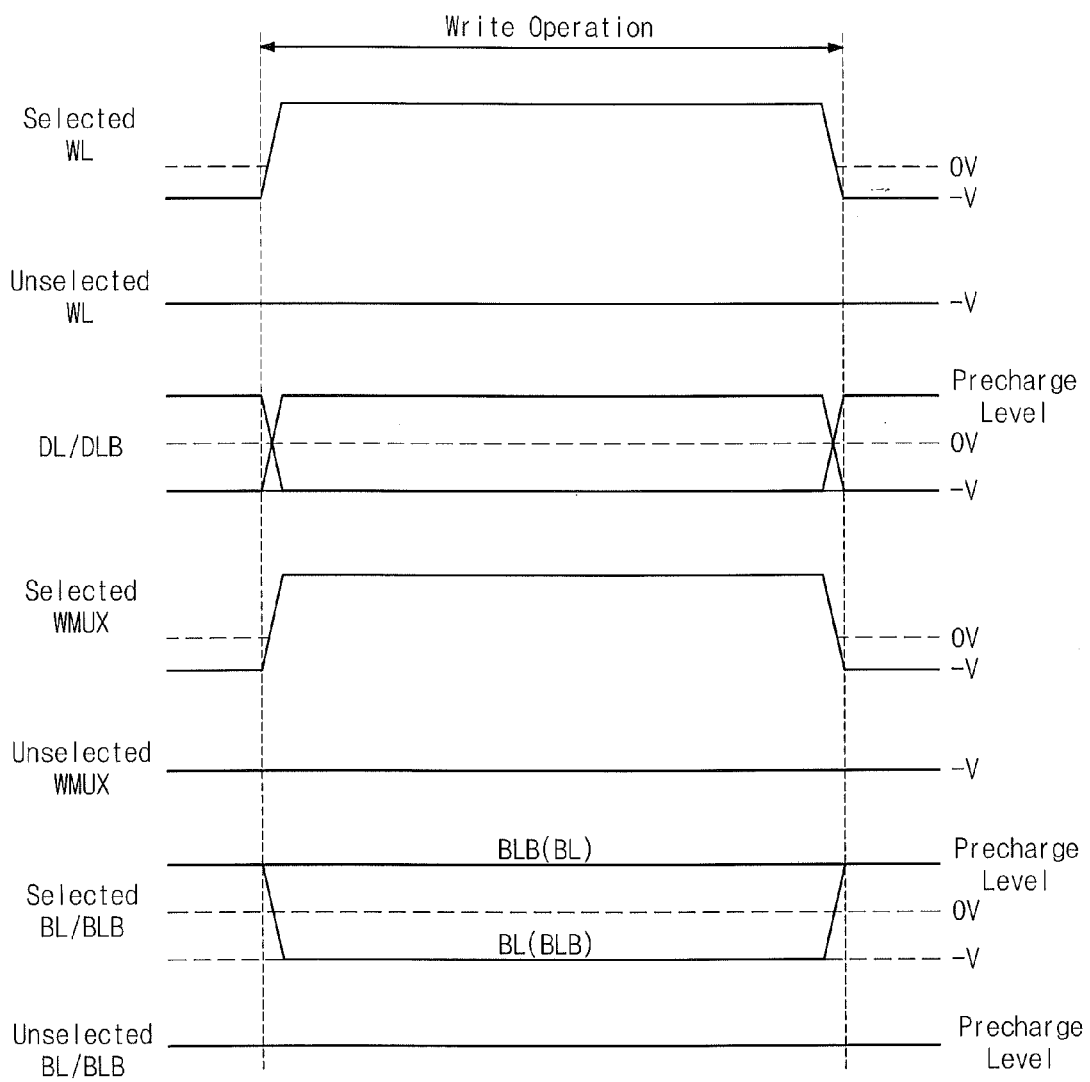
FIG. 3 is a timing diagram for describing a write operation of a static random access memory device according to an exemplary embodiment of the inventive concept.

FIG. 3 is a timing diagram for describing a write operation of a static random access memory device according to an exemplary embodiment of the inventive concept. In accordance with an exemplary embodiment of the inventive concept, a negative voltage is applied to a selected bit line pair in order to improve the write margin at a write operation. The negative voltage is applied through a write driver 122 (refer to FIG. 1). For example, the write driver 122 applies a negative voltage to any one bit line of the selected bit line pair according to data being written in a selected memory cell 111.

If data being written in the selected memory cell 11 is data '0', the write driver 122 drives a data line DL with a negative voltage −V. The negative voltage applied to the data line DL is transferred to a selected bit line BL0 via a pass gate YPN0 when a Y-pass gate signal WMUX0 is activated. That is, the negative voltage −V is applied to the selected bit line BL0. On the other hand, if data being written in the selected memory cell 11 is data '1', the write driver 122 drives an inverted data line (or, a data bar line) DLB with the negative voltage −V. The negative voltage applied to the data bar line DLB is transferred to a selected bit bar line BLB0 via a pass gate YPBN0 when the Y-pass gate signal WMUX0 is activated. That is; the negative voltage −V is applied to the selected bit bar line BLB0.

When a negative voltage is applied to any one bit line of a selected bit line pair according to data being written in a selected memory cell 111, there increases the amount of a current flowing via the first or second pass transistor PG or PGB corresponding to a bit line of the selected bit line pair. As the amount of a current flowing via the first or second pass transistor PG or PGB increases, the write margin of the selected memory cell 111 may be improved.

When a negative voltage is applied to a selected bit line pair to improve the write margin, the side effect may arise at peripheral memory cells except for the selected memory cell 111. For example, if a negative voltage is applied to the selected bit line pair, the retention characteristic of a half-selected memory cell 115 or unselected memory cells 116 and 117 may be lowered. If the retention characteristic of the half-selected memory cell 115 or unselected memory cells 116 and 117 is lowered, the half-selected memory cell 115 or unselected memory cells 116 and 117 may cause data errors due to change of stored data values.

A negative voltage −V may be applied to an unselected word line WLm in order to prevent the retention characteristic of the unselected memory cell 116 from being lowered due to the negative voltage −V applied to any one bit line of a selected bit line pair. In particular, if the negative voltage −V is applied to the unselected word line WLm, it is applied to gates of the first and second pass gate transistor of the unselected memory cell 116. Since the negative voltage −V is applied to a source and a gate of the first or second pass gate transistor of the unselected memory cell 116, the first or second pass gate transistor of the unselected memory cell 116 will not be turned on. Accordingly, no data of the unselected memory cell 116 is changed. In other words, if an unselected word line WLm is grounded at a write operation, any one of the first and second pass gate transistors of an unselected memory cell 116 may become turned on. This means that data of the unselected memory cell 116 can be changed. Accordingly, this problem may be prevented by biasing the unselected word line WLm with a negative voltage −V.

Further, at a write operation, the negative voltage −V is applied to a Y-pass gate of an unselected bit line pair in order to prevent the retention characteristic of the half-selected memory cell 115 from being lowered due to the negative voltage −V applied to the data line DL or the data bar line DLB. That is, an unselected Y-pass gate signal WMUXn has the negative voltage −V. Since the negative voltage −V is applied to sources and gates of the pass gates YPNn and YPBNn connected with the unselected bit line pair BLn and BLBn, the pass gates YPNn and YPBNn connected with the unselected bit line pair BLn and BLBn are turned off. This means that the unselected bit line pair BLn and BLBn is maintained at a pre-charged level. If the unselected bit line pair BLn and BLBn is maintained at a pre-charged level, the first and second pass gates of the half-selected memory cell 115 are turned off although the selected word line WL0 is activated. This means that data of the half-selected memory cell 115 is not changed.

In accordance with an exemplary embodiment of the inventive concept, at a write operation, a negative voltage is applied to any one bit line of a selected bit line pair, unselected word lines, and Y-pass gates of unselected bit line pairs. The unselected word lines and Y-pass gates of unselected bit line pairs may be driven with the negative voltage at the same time when the negative voltage is applied to any one bit line of a selected bit line pair according to data being written. Accordingly, it is possible to improve not only the write margin of a selected memory cell but also the data stability of unselected memory cells.

Figure 4:
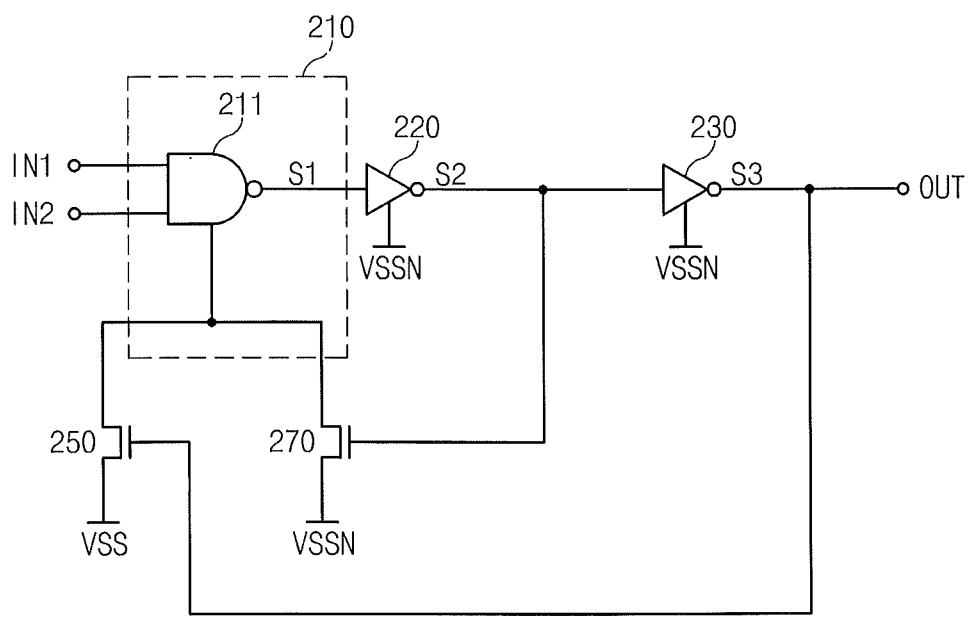
FIG. 4 is a circuit diagram showing a negative level shifter according to an exemplary embodiment of the inventive concept.

FIG. 4 is a circuit diagram showing a negative level shifter according to an exemplary embodiment of the inventive concept. A level shifter is used to connect two logic blocks which operate at different voltage levels. For example, a level shifter is used to connect a logic block using a ground voltage and a logic block using a negative voltage lower than a ground voltage. With an exemplary embodiment of the inventive concept, at a write (or, read) operation, a negative voltage level shifter 200 is used to apply a negative voltage which is provided from an external source of a static random access memory device 100 (refer to FIG. 1) or is generated by an internal voltage generator (not shown).

Referring to FIG. 4, the negative voltage level shifter 200 includes a logic gate block 210, the first inverter 220, the second inverter 230, the first NMOS transistor 250, and the second NMOS transistor 270. The logic gate block 210 may be formed of one logic gate or a combination of two or more logic gates. Herein, the logic gate is a unit of a logic circuit such as an AND gate, an OR gate, an inverter, a NAND gate, a NOR gate, a multiplexer, or a de-multiplexer. The logic gate block 210 and the first and second inverters 220 and 230 are connected in series between an input and an output of the level shifter 200. The first and second inverters 220 and 230 are supplied with a negative voltage VSSN. The NAND gate 211 of the logic gate block 210 is supplied with a ground voltage VSS via the first NMOS transistor 250 or with a negative voltage VSSN via the second NMOS transistor 270. Either one of the ground voltage VSS and the negative voltage VSSN may be supplied to the NAND gate 211 according to output signals of the first and second inverters 220 and 230. Accordingly, a logic block using a ground voltage and a logic block using a negative voltage may be connected by the negative voltage level shifter 200. An operation of the negative voltage level shifter 200 will be more fully described with reference to FIG. 5.

Figure 5:
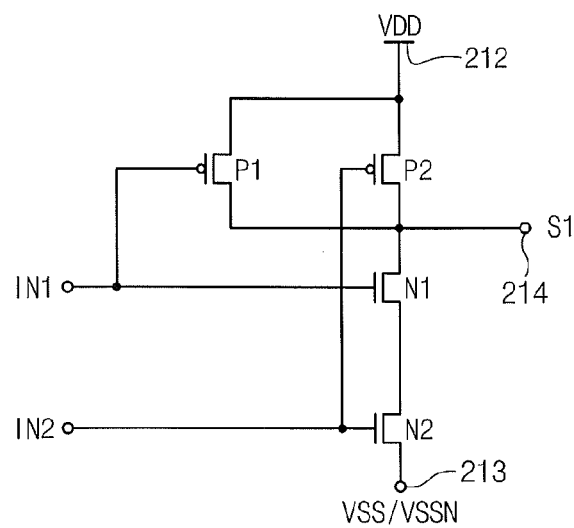
FIG. 5 is a circuit diagram showing a NAND gate illustrated in FIG. 4.

FIG. 5 is a circuit diagram showing a NAND gate illustrated in FIG. 4. Referring to FIG. 5, a NAND gate 211 includes the first and second PMOS transistors P1 and P2 and the first and second NMOS transistors N1 and N2. The second PMOS transistor P2 and the first and second NMOS transistors N1 and N2 are connected in series between a power terminal 212 supplied with a power supply voltage VDD and a ground terminal 213 supplied with a negative voltage VSSN or a ground voltage VSS. The first PMOS transistor P1 is connected between the power terminal 212 and an output terminal 214 and its gate is connected to receive an input signal N1. Gates of the transistors P2 and N2 are connected to receive an input signal IN2, and a gate of the transistor N1 is connected to receive the input signal IN2. The input signals N1 and IN2 may correspond an input signal (for example, a write control signal, write data, and an address signal) which will be described below.

When the input signals IN1 and IN2 all are logically 'high', the PMOS transistors P1 and P2 of the NAND gate 211 are turned off, and the NMOS transistors N1 and N2 thereof are turned on. Since the NMOS transistors N1 and N2 are turned on, the output terminal 214 of the NAND gate 211 is connected to either one of the ground voltage VSS and the negative voltage VSSN. That is, the NAND gate 211 outputs an output signal S1 of a logically low level. In this case, a voltage level of the output signal S1 may be determined according to states of NMOS transistors 250 and 270 of a negative voltage level shifter 200.

An inverter 220 in FIG. 4 outputs an output signal S2 of a logically high level in response to the output signal S1 of a logically low level. Since the NMOS transistor 270 of the level shifter 200 is turned on in response to the output signal S2 of a logically high level, a negative voltage VSSN is supplied to a ground terminal 213 of the NAND gate 211. The second inverter 230 outputs an output signal S3 of a logically low level in response to the output signal S2 of a logically high level. Since the negative voltage VSSN is applied to a ground terminal of the second inverter 230, a logically low level of the output signal S3 may be a level of a negative voltage VSSN. As described above, the negative voltage level shifter 200 stably performs a level shift operation via two switch transistors 250 and 270 which transfer a ground voltage VSS and a negative voltage VSSN. The negative voltage level shifter 200 may be used to apply a negative voltage to any one bit line of a selected bit line pair, unselected word lines, and Y-pass gates of unselected bit line pairs at a write operation.

Figure 6A:
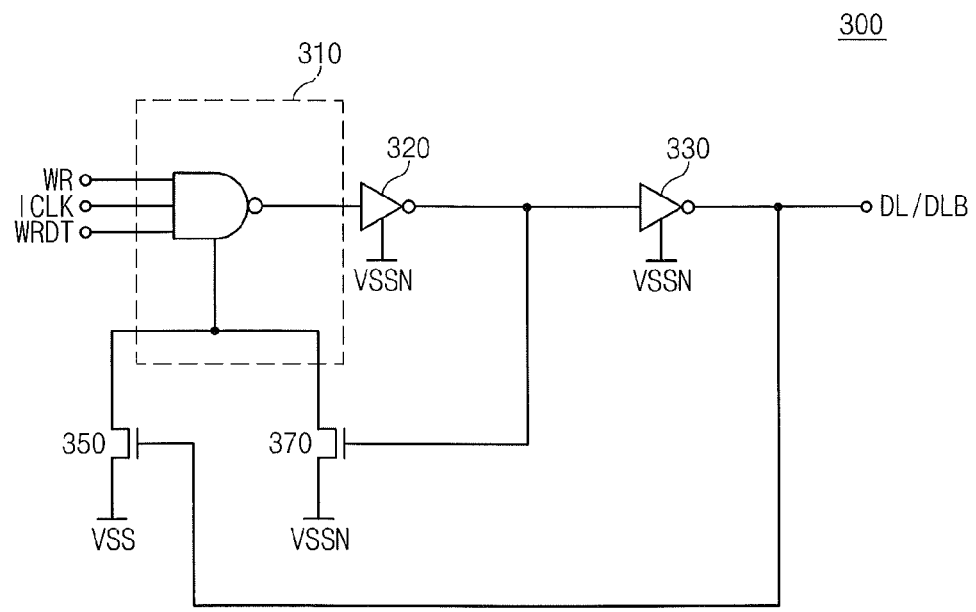
FIGS. 6A to 6C are circuit diagrams showing negative voltage level shifters of a write driver, a row decoder and a column decoder, respectively.
Figure 6B:
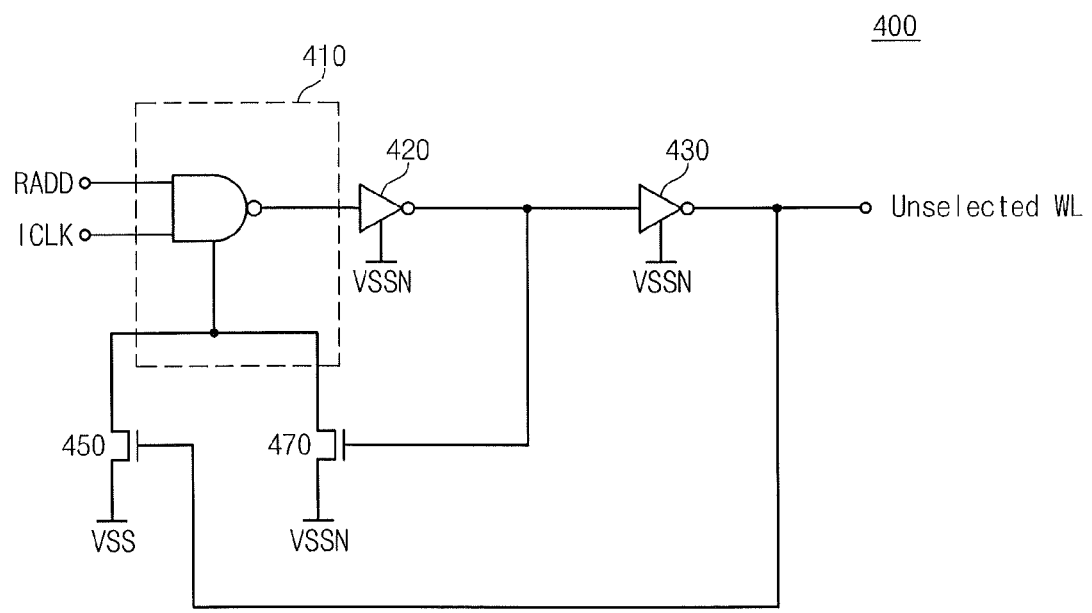
Figure 6C:
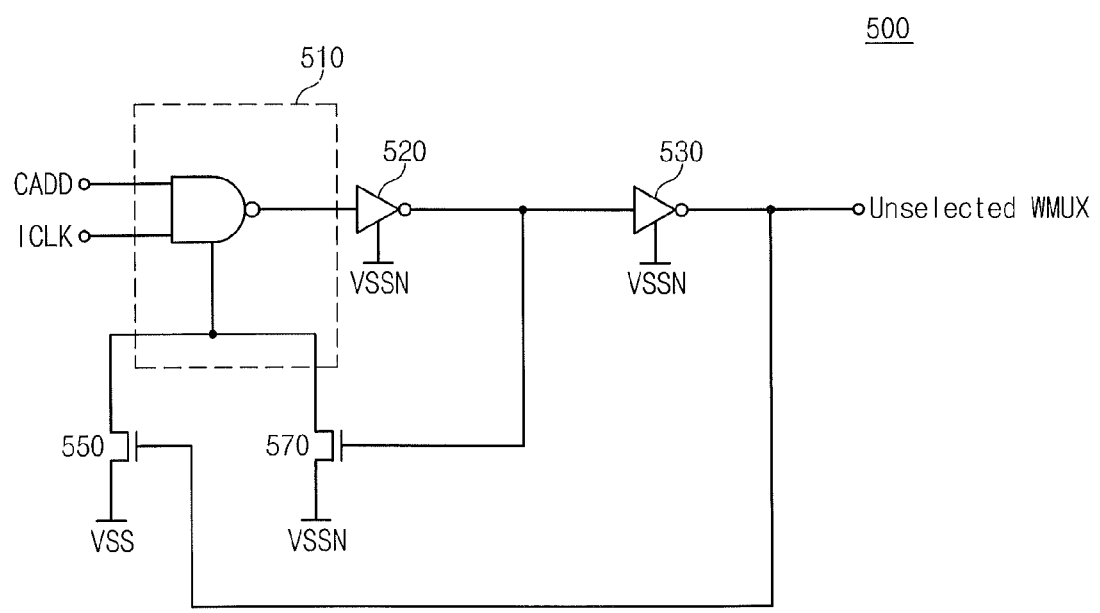

FIGS. 6A to 6C are circuit diagrams showing negative voltage level shifters of a write driver, a row decoder and a column decoder, respectively. A negative voltage level shifter 300 of a write driver 122 (refer to FIG. 1) illustrated in FIG. 6A may apply a negative voltage VSSN to any one bit line of a selected bit line pair at a write operation. The negative voltage level shifter 300 applies the negative voltage VSSN to a data line DL or a data bar line DLB in response to a write control signal WR, an internal clock signal ICLK, and write data WRDT.

A negative voltage level shifter 400 of a row decoder 140 (refer to FIG. 1) illustrated in FIG. 6B may apply a negative voltage VSSN to an unselected word line in response to an address signal RADD and an internal clock signal ICLK at a write operation. A negative voltage level shifter 500 of a column decoder 150 (refer to FIG. 1) illustrated in FIG. 6C may apply a negative voltage VSSN to a Y-pass gate of an unselected bit line pair in response to an address signal CADD and an internal clock signal ICLK at a write operation. The negative voltage level shifters 300 to 500 operate to be identical to that described in FIGS. 4 and 5, and description thereof is thus omitted.

Figure 7:
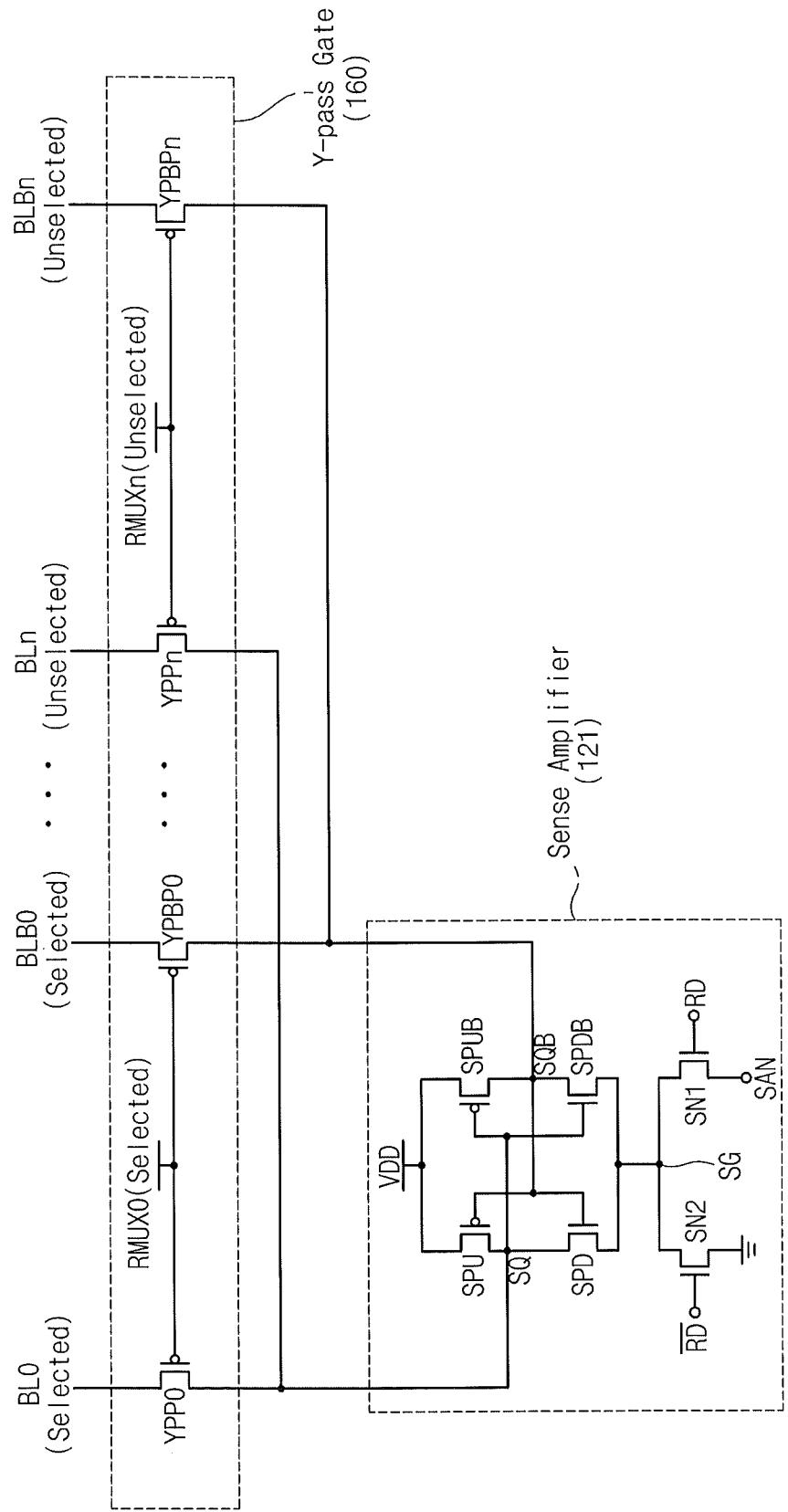
FIG. 7 is a circuit diagram a Y-pass gate and a sense amplifier of a static random access memory device illustrated in FIG. 1.

FIG. 7 is a circuit diagram a Y-pass gate and a sense amplifier of a static random access memory device illustrated in FIG. 1. Referring to FIG. 7, a sense amplifier 121 of a static random access memory device 100 may be connected to a plurality of bit line pairs (BL0, BLB0) to (BLn, BLBn). For example, one sense amplifier 121 may correspond to four bit line pairs. At a read operation, the sense amplifier 121 is connected with any one of four bit line pairs which is selected through a Y-pass gate 160 under the control of a column decoder 150. The sense amplifier 121 includes the first and second pull-up transistors SPU and SPUB, the first and second pull-down transistors SPD and SPDB, and NMOS transistors SN1 and SN2.

One end of the first pull-up transistor SPU is connected to receive a driving operation VDD of the sense amplifier 121, and the other end thereof is connected to the first sensing node SQ. One end of the first pull-down transistor SPD is connected to the first sensing node SQ, and the other end thereof is connected to a ground node SG of the sense amplifier 121. The first pull-up and pull-down transistors SPU and SPD are controlled by a signal of the second sensing node SQB, and the driving operation VDD or a voltage of the ground node SG is supplied to the first sensing node SQ via the first pull-down transistor SPD.

One end of the second pull-up transistor SPUB is connected to receive the driving operation VDD of the sense amplifier 121, and the other end thereof is connected to the second sensing node SQB. One end of the second pull-down transistor SPDB is connected to the second sensing node SQB, and the other end thereof is connected to the ground node SG of the sense amplifier 121. The second pull-up and pull-down transistors SPUB and SPDB are controlled by a signal of the first sensing node SQ, and the driving operation VDD or a voltage of the ground node SG is supplied to the second sensing node SQB via the second pull-down transistor SPDB. The NMOS transistors SN1 and SN2 are connected to the ground node SG of the sense amplifier 121, respectively. The NMOS transistor SN1 transfers a negative voltage SAN to the ground node SG in response to a read control signal RD. The NMOS transistor SN2 transfers a ground voltage to the ground node SG in response to an inverted read control signal /RD.

In order to improve the sensing characteristic (for example, to improve the sensing margin or to reduce a sensing time) when data stored in a selected memory cell is read, it is necessary to increase the amount of a current flowing into the sense amplifier 121 or to widen a range of an operating voltage of the sense amplifier 121. The amount of a current flowing into the sense amplifier 121 from a selected bit line pair may be controlled according to a turn-on state of a Y-pass gate 160. That is, at a read operation, the amount of a current flowing into the sense amplifier 121 from a selected bit line pair may increase when a signal of the Y-pass gate 160 is set to have a voltage lower than a ground voltage. Further, a range of an operating voltage of the sense amplifier 121 may widen when a voltage of the ground node SG of the sense amplifier 121 is maintained to be lower than a ground voltage. The above-described read operations of the static random access memory device 100 will be more fully described with reference to FIG. 8.

Figure 8:
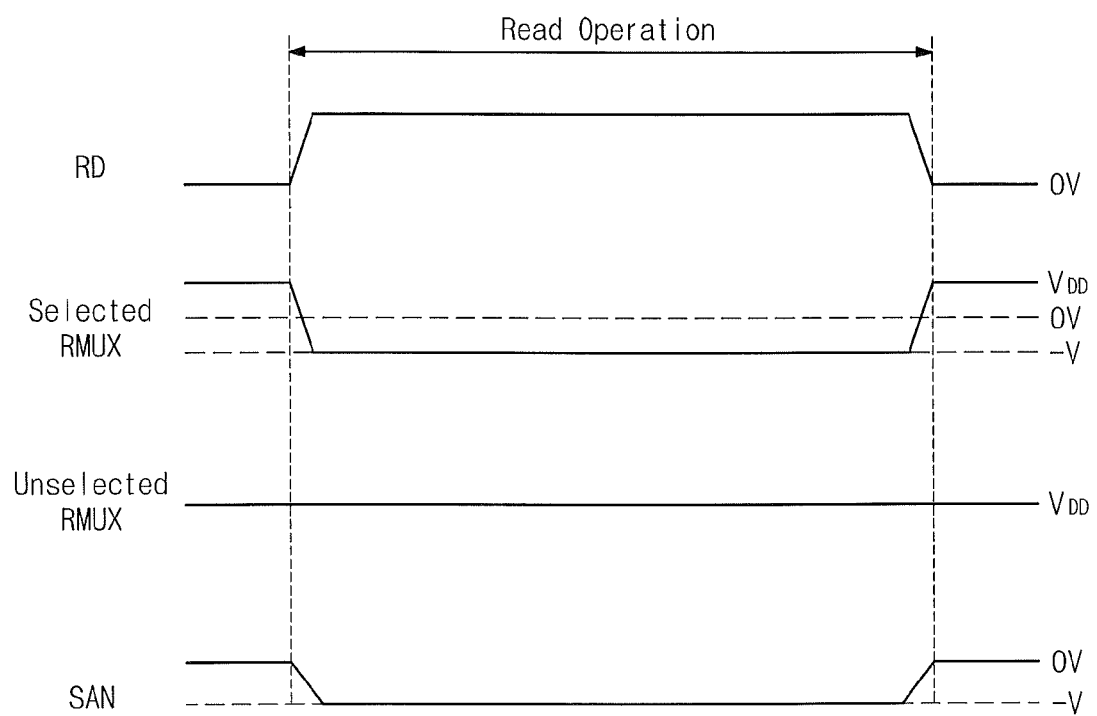
FIG. 8 is a timing diagram for describing a read operation of a static random access memory device according to an exemplary embodiment of the inventive concept.

FIG. 8 is a timing diagram for describing a read operation of a static random access memory device according to an exemplary embodiment of the inventive concept. In accordance with an exemplary embodiment of the inventive concept, a negative voltage −V is applied to a Y-pass gate of a selected bit line pair BL0 and BLB0 in order to improve the sensing characteristic (for example, to improve the sensing margin or to reduce a sensing time) at a read operation. That is, a selected Y-pass gate signal RMUX0 has a negative voltage −V. Since the negative voltage −V is applied to gates of low-voltage pass gates YPP0 and YPBP0 connected with bit lines BL0 and BLB0 of the selected bit line pair, the low-voltage pass gates YPP0 and YPBP0 connected with bit lines BL0 and BLB0 of the selected bit line pair may be turned on fully. This means that there increases the amount of a current flowing into a sense amplifier 121 from the selected bit line pair BL0 and BLB0. On the other hand, low-voltage pass gates connected with unselected bit line pairs may be turned off.

At a read operation, the negative voltage −V is applied to a ground node SG of the sense amplifier 121. The sense amplifier 121 reads data stored in a selected memory cell by amplifying a voltage difference between a bit line BL0 and a bit bar line BLB0 connected with the selected memory cell. For this reason, the sensing characteristic of the sense amplifier 121 may be improved when a range of an operating voltage of the sense amplifier 121 widens. Accordingly, a negative voltage SAN is applied to the ground node SG of the sense amplifier 121. The negative voltage SAN is supplied to the ground voltage SG via an NMOS transistors SN1 which is activated by a read control signal RD provided at a read operation. On the other hand, when no read operation is executed, a ground voltage is applied to the ground node SG via an NMOS transistor SN2 which is controlled by an inverted read control signal /RD. Although not shown in FIG. 8, at a read operation, a selected word line may be driven with a voltage enough to turn on pass transistors of a selected memory cell, and unselected word lines may be grounded.

Figure 9A:
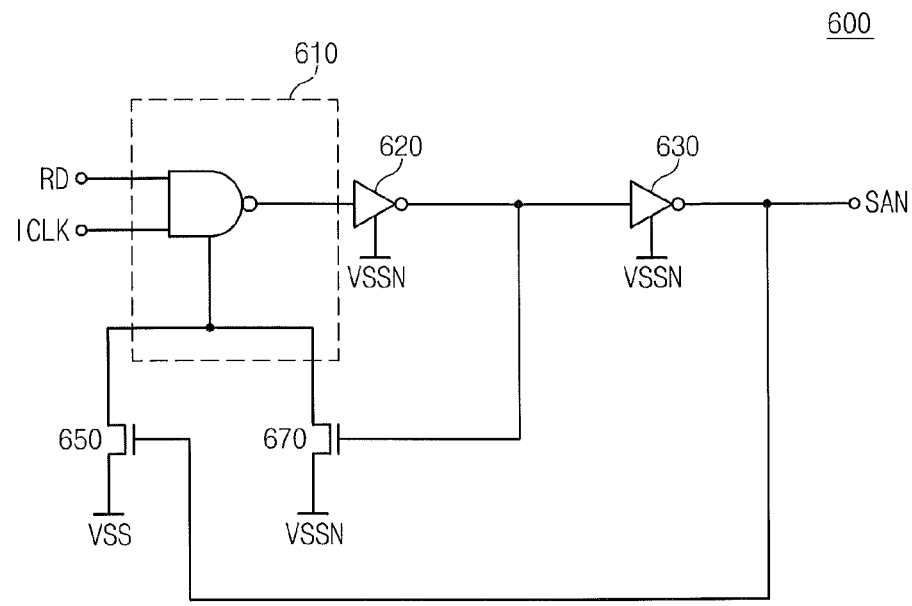
FIGS. 9A and 9B are circuit diagrams showing negative voltage level shifters of a sense amplifier and a column decoder.
Figure 9B:
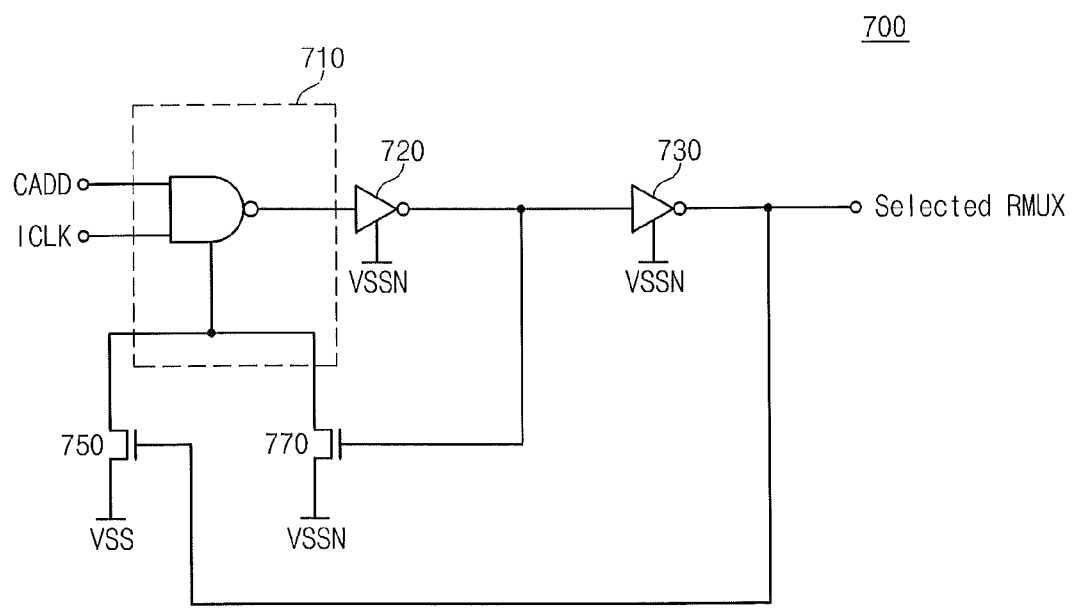

FIGS. 9A and 9B are circuit diagrams showing negative voltage level shifters of a sense amplifier and a column decoder. Referring to FIG. 9A, there is shown a negative voltage level shifter 600 of a sense amplifier 121. The negative voltage level shifter 600 is configured to apply a negative voltage to a ground node SG of the sense amplifier 121 at a read operation. The negative voltage level shifter 600 provides a negative voltage VSSN to a ground node SG via an NMOS transistor SN1 in response to a read control signal RD and an internal clock signal ICLK. Although not shown in figures, the negative voltage level shifter 600 may be implemented to be included in the sense amplifier 121.

Referring to FIG. 9B, there is shown a negative voltage level shifter 700 of a column decoder 150. The negative voltage level shifter 700 is configured to a negative voltage to a Y-pass gate of a selected bit line pair at a read operation. The negative voltage level shifter 700 provides the negative voltage VSSN to the selected bit line pair in response to a column address CADD and an internal clock signal ICLK. The negative voltage level shifters 600 and 700 in FIGS. 9A and 9B operate to be identical to those in FIGS. 4 and 5, and description thereof is thus omitted.

Figure 10:
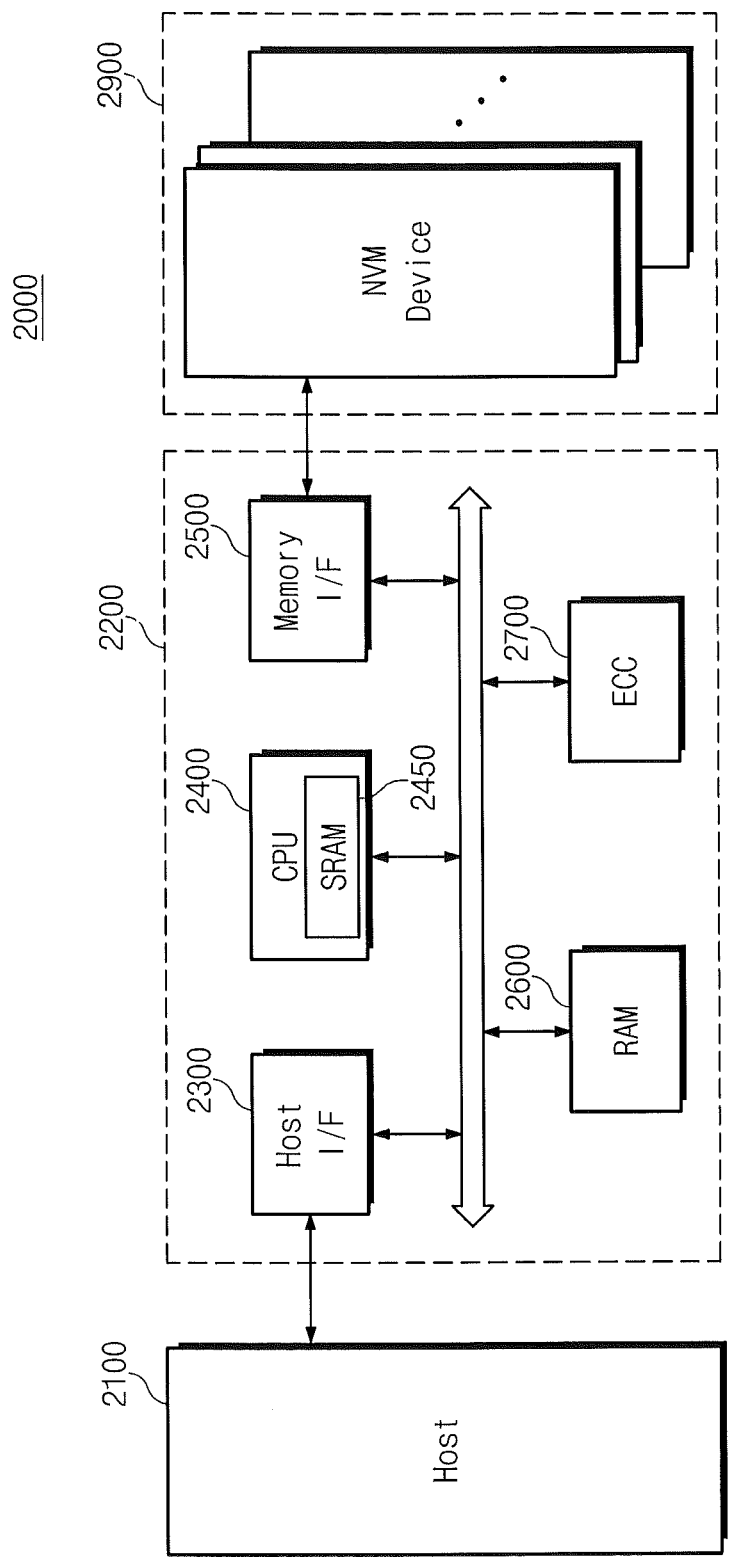
FIG. 10 is a block diagram showing a user device including a static random access memory device according to an exemplary embodiment of the inventive concept.

FIG. 10 is a block diagram showing a user device including a static random access memory device according to an exemplary embodiment of the inventive concept. Referring to FIG. 10, a user device 2000 includes a host 2100, a memory controller 2200, and a storage media 2900 composed of a plurality of non-volatile memory devices. The memory controller 2200 is connected with the host 2100 and the storage media 2900. In response to a request from the host 2100, the memory controller 2200 accesses the storage media 2900. For example, the memory controller 2200 controls read, write, and erase operations of the non-volatile memory devices in the storage media 2900. The memory controller 2200 is configured to interface the storage media 2900 and the host 2100. The memory controller 2200 is configured to drive firmware for controlling the non-volatile memory devices in the storage media 2900. The memory controller 2200 includes well-known elements such as a host interface 2300, a CPU 2400, a memory interface 2500, a RAM 2600, and an ECC block 2700. The CPU 2400 may include a random access memory device 2450 according to an exemplary embodiment of the inventive concept. The RAM 2600 may be used as a working memory of the CPU 2400. The static random access memory device 2450 may be used as a cache memory of the CPU 2400. The CPU 2400 controls an overall operation of the memory controller 2200.

The host interface 2300 may include the protocol for executing data exchange between the host 2100 and the memory controller 2200. For example, the host interface 2300 may be configured to communicate with the host 2100 via any one of various interface protocols such USB (Universal Serial Bus) protocol, MMC (Multimedia Card) protocol, PCI (Peripheral Component Interconnection) protocol, PCI-E (PCI-Express) protocol, ATA (Advanced Technology Attachment) protocol, SATA (Serial ATA) protocol, SCSI (Small Computer Small Interface) protocol, ESDI (Enhanced Small Disk Interface) protocol, IDE (Integrated Drive Electronics), and the like.

The ECC block 2700 is configured to detect and correct errors of data read from the storage media 2900. The ECC block 2700 can be provided as an element of the memory controller 2200 or each of the non-volatile memory devices in the storage media 2900. The memory interface 2500 interfaces the storage media 2900 and the memory controller 2200.

It is well understood that the memory controller 220 is not limited to this disclosure. For example, the memory controller 2200 may further include a ROM which stores code data necessary for an initial booting operation and data for interfacing with the host 2100.

The memory controller 2200 and the non-volatile memory devices in the storage media 2900 are integrated on a single semiconductor chip to form a memory card. For example, the memory controller 2200 and the non-volatile memory devices in the storage media 2900 are integrated on a single semiconductor chip to form PCMCIA (personal computer memory card international association) card, CF (compact flash) card, smart media card, memory stick, multi media card (MMC, RS-MMC, MMC-micro), SD (secure digital) card (SD, Mini-SD, Micro-SD, SDHC), UFS (universal flash storage), and the like.

In another embodiment, the memory controller 2200 and the non-volatile memory devices in the storage media 2900 may be applied to a solid state drive, a computer, a portable computer, an UMPC (ultra mobile personal computer), a work station, a net book, a PDA, a web tablet, a wireless phone, a mobile phone, a digital camera, a digital audio recorder, a digital audio player, a digital video recorder, a digital video player, a device capable of receiving and transmitting information in a wireless circumstance, one of electronic devices constituting a home network, one of electronic devices constituting a computer network, one of electronic devices constituting a telematics network, one of elements constituting a computer system, an RFID (radio frequency identification) device, or an embedded system.

The CPU 2400 of the user device 2000 may include the static random access memory device 2450 in FIG. 1 according to an exemplary embodiment of the inventive concept. The static random access memory device 2450 is configured to apply a negative voltage to any one bit line of a selected bit line pair according to data being written in a selected memory cell, in order to improve the write margin at a write operation. Further, the static random access memory device 2450 is configured to apply a negative voltage to unselected word lines in order to prevent the retention characteristics of unselected memory cells from being lowered due to the negative voltage applied to the selected bit line pair at a write operation. Still further, the static random access memory device 2450 is configured to apply the negative voltage to Y-pass gates of unselected bit line pairs, in order to prevent the retention characteristics of half-selected memory cells (connected with a selected data line pair) from being lowered due to a negative voltage applied to the selected data line pair (connected with the selected bit line pair) at a write operation. On the other hand, the static random access memory device 2450 is configured to apply a negative voltage to a ground node SG of a sense amplifier 121 and a Y-pass gate of a selected bit line pair in order to improve the sensing characteristics (for example, to improve the sensing margin or to reduce a sensing time) at a read operation.

Figure 11:
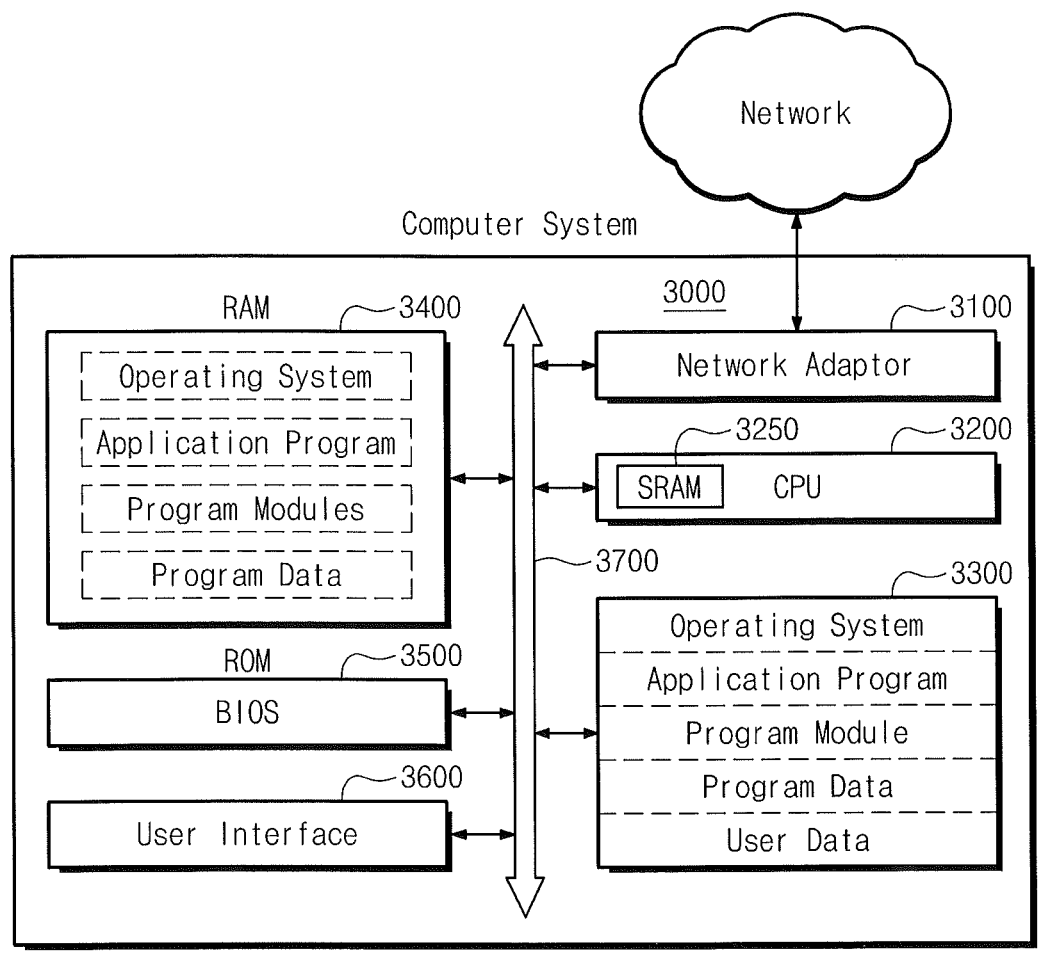
FIG. 11 is a block diagram showing a computer system including a static random access memory device according to an exemplary embodiment of the inventive concept.

FIG. 11 is a block diagram showing a computer system including a static random access memory device according to an exemplary embodiment of the inventive concept. A computer system 3000 according to an exemplary embodiment of the inventive concept includes a network adaptor 3100, a CPU 3200, a data storage device 3300, a RAM 3400, a ROM 3400, and a user interface 3600 which are electrically connected with a system bus 3700. The CPU 3200 includes a static random access memory device 3250 according to an exemplary embodiment of the inventive concept. The network adaptor 3100 provides interfacing between the computer system 3000 and external networks. The CPU 3200 performs the overall operation for driving an operating system and an application program resident on the RAM 3400. The CPU 3200 uses the static random access memory device 3250 as a cache memory to execute the overall operation. The static random access memory device 3250 may be configured to a negative voltage to any one bit line of a selected bit line pair, unselected word lines, and pass gates of unselected bit line pairs at a write operation. Further, the static random access memory device 3250 may be configured to apply a negative voltage to a pass gate of a selected bit line and a ground node SG of a sense amplifier 121. Therefore, the static random access memory device 3250 may execute write and read operations stably.

The data storage device 3300 stores data needed for the computer system 3000. For example, the data storage device 3300 may store an operating system for driving the computer system 3000, an application program, various program modules, program data, and user data. The RAM 3400 may be used as a working memory of the computer system 3000. Upon booting, an operating system, an application, various program modules, and program data needed to drive programs may be loaded on the RAM 3400. The ROM 3500 may be used to store a basic input/output system (BIOS), which is activated before the operating system is driven, upon booting. Information exchange between the computer system 3000 and a user may be made through the user interface 3600. Besides, the computer system 3000 may further comprise a battery, a modem, and the like. Further, although not shown in FIG. 11, the computer system 300 may include an application chipset, a camera image processor (CIS), a mobile DRAM, and the like.

The above-disclosed subject matter is to be considered illustrative, and not restrictive, and the appended claims are intended to cover all such modifications, enhancements, and other embodiments, which fall within the true spirit and scope. Thus, to the maximum extent allowed by law, the scope is to be determined by the broadest permissible interpretation of the following claims and their equivalents, and shall not be restricted or limited by the foregoing detailed description.

What is claimed is:

1. An integrated circuit memory device, comprising:
    an array of static random access memory (SRAM) cells arranged as a plurality of columns of SRAM cells electrically coupled to corresponding plurality of pairs of bit lines and a plurality of rows of SRAM cells electrically coupled to a corresponding plurality of word lines;
    a word line driver electrically coupled to the plurality of word lines, said word line driver configured to drive a selected word line with a positive voltage and a plurality of unselected word lines with a negative voltage during an operation to write data into a selected one of the SRAM cells; and
    a column decoder comprising a plurality of pairs of selection switches electrically coupled to corresponding ones of the plurality of pairs of bit lines, said column decoder configured to drive control terminals of a first of the plurality of pairs of selection switches coupled to the selected one of the SRAM cells with positive voltages concurrently with driving control terminals of a second of the plurality of pairs of selection switches coupled to an unselected one of the SRAM cells with negative voltages during the operation to write data;
    wherein the selection switches are NMOS pass gate transistors;
    wherein the control terminals of the selection switches are gate electrodes of respective NMOS pass gate transistors; and
    wherein the gate electrodes of the NMOS pass gate transistors associated with the second of the plurality of pairs of selection switches receive the negative voltages during the operation to write data.

2. The device of claim 1, wherein said word line driver comprises a row decoder therein electrically coupled to the plurality of word lines.

3. The device of claim 2, further comprising a write driver electrically coupled to said column decoder, said write driver configured to drive a first of a pair of bit lines electrically coupled to the selected one of the SRAM cells with a negative voltage during the operation to write data concurrently with holding a pair of bit lines electrically coupled to the unselected one of the SRAM cells at precharged voltage levels.

4. The device of claim 3, wherein said write driver and the row decoder comprise respective negative voltage level shifters therein.

5. A static random access memory device comprising:
    memory cells each connected with word lines and bit line pairs;
    a row decoder selecting one of the word lines in response to a row address;
    a column decoder selecting one of the bit line pairs in response to a column address;
    a write driver writing data in a selected memory cell connected with the selected word line and bit line pair; and
    control logic controlling the write driver to apply a negative voltage to one bit line of the selected bit line pair, the row decoder to apply the negative voltage to unselected word lines, respectively, and the column decoder to apply the negative voltage to gate terminals of NMOS selection switches of each of unselected bit line pairs, at a write operation.

6. The static random access memory device of claim 5, wherein under the control of the control logic, the negative voltage is applied to one bit line of the selected bit line pair, the unselected word lines, and the gate terminals of the NMOS selection switches of each of the unselected bit line pairs.

7. The static random access memory device of claim 5, wherein each of the write driver, the row decoder, and the column decoder includes a negative voltage level shifter.

8. The static random access memory device of claim 7, wherein the negative voltage level shifter in the write driver is configured to transfer the negative voltage in response to a write control signal from the control logic and write data.

9. The static random access memory device of claim 8, wherein the negative voltage level shifter in the row decoder is configured to transfer the negative voltage in response to a row address from the control logic.

10. The static random access memory device of claim 9, wherein the negative voltage level shifter in the column decoder is configured to transfer the negative voltage in response to a column address from the control logic.

11. The static random access memory device of claim 7, wherein the negative voltage level shifter in each of the write driver, the row decoder, and the column decoder comprises:
    a logic gate block outputting a voltage of a power terminal or a voltage of a ground terminal as a first signal in response to input signals;
    a first inverter inverting a second signal in response to the first signal;
    a second inverter inverting a third signal in response to the second signal;
    a first switching circuit transferring a first voltage as a ground voltage of the logic gate block in response to the second signal; and
    a second switching circuit transferring a second voltage as a ground voltage of the logic gate block in response to the third signal, the first voltage being lower than the second voltage.

12. The static random access memory device of claim 11, wherein the logic gate block is formed of a combination of a plurality of logic gates.

13. The static random access memory device of claim 5, wherein under the control of the control logic, the negative voltage is applied to the one bit line of the selected bit line pair according to data being written in the selected memory cell.

* * * * *